(12) United States Patent
Bajdechi et al.

(10) Patent No.: US 7,710,179 B2
(45) Date of Patent: May 4, 2010

(54) PROGRAMMABLE GAIN ATTENUATOR FOR TRACK AND HOLD AMPLIFIERS

(75) Inventors: Ovidiu Bajdechi, Delft (NL); Franciscus Maria Leonardus van der Goes, The Hague (NL)

(73) Assignee: Broadcom Corporation, Irvine, CA (US)

( * ) Notice: Subject to any disclaimer, the term of this patent is extended or adjusted under 35 U.S.C. 154(b) by 46 days.

(21) Appl. No.: 11/341,384

(22) Filed: Jan. 30, 2006

(65) Prior Publication Data

US 2007/0176664 A1 Aug. 2, 2007

(51) Int. Cl.
*H03L 5/00* (2006.01)
(52) U.S. Cl. .................................. 327/306; 327/308
(58) Field of Classification Search .............. 327/306, 327/308
See application file for complete search history.

(56) References Cited

U.S. PATENT DOCUMENTS

| | | | | |
|---|---|---|---|---|
| 3,590,366 A | * | 6/1971 | Vaughn et al. | 323/354 |
| 3,882,484 A | * | 5/1975 | Brokaw et al. | 341/127 |
| 4,354,159 A | * | 10/1982 | Schorr et al. | 330/86 |
| 5,523,721 A | * | 6/1996 | Segawa et al. | 330/86 |
| 5,563,557 A | * | 10/1996 | Sasaki | 333/81 R |
| 5,880,618 A | * | 3/1999 | Koen | 327/351 |
| 6,703,885 B1 | * | 3/2004 | Fan et al. | 327/308 |
| 7,196,566 B2 | * | 3/2007 | Kaiser, Jr. | 327/308 |
| 2005/0174157 A1 | * | 8/2005 | Calo' et al. | 327/308 |

* cited by examiner

*Primary Examiner*—Lincoln Donovan
*Assistant Examiner*—Ryan C Jager
(74) *Attorney, Agent, or Firm*—Sterne, Kessler, Goldstein & Fox P.L.L.C.

(57) ABSTRACT

A programmable gain attenuator (PGA) in particular to be used in a track-and-hold circuit is disclosed. The PGA is located in the feedback path around an operational amplifier. One tap switch is used to connect one PGA section to the output of the operational amplifier. The PGA section is capable of producing a multiplicity of different gain settings by using a multiplicity of secondary resistive devices in a voltage divider, wherein the resistive devices each can be independently coupled to a reference voltage.

9 Claims, 7 Drawing Sheets

PROGRAMMABLE GAIN ATTENUATOR FOR TRACK AND HOLD AMPLIFIERS

BACKGROUND OF THE INVENTION

The invention pertains to the general field of track-and-hold amplifiers. In particular this invention pertains to the development of programmable gain attenuators, so called PGAs, for track and hold amplifiers.

The general purpose of track-and-hold amplifiers is to accurately track an analog input signal and, at specified times, to accurately hold at its output for a certain length of time the instantaneous value of the input signal. This form of signal conditioning is particularly important ahead of analog-to-digital converters, where the quality of conversion is improved by maintaining a substantially constant value at the input of the analog-to-digital converter during the conversion process.

Programmable gain attenuators are used in various analog signal-processing applications where an electrical signal of varying amplitude must be either amplified or attenuated before subsequent signal processing. Various gain and/or attenuation settings are required to accommodate the wide dynamic range of the electrical signal.

Programmable gain attenuators for track-and-hold amplifiers are known from the state of the art. However as circuits become faster and faster there is a need for providing an improved PGA that can be used in these high frequency circuits.

BRIEF SUMMARY OF THE INVENTION

The invention is aimed at providing an improved programmable gain attenuator for track-and-hold amplifiers, substantially as shown in and/or described in connection with at least one of the figures, as set forth more completely in the claims.

BRIEF DESCRIPTION OF THE DRAWINGS/FIGURES

The above and other features, aspects and advantages of the present invention will be more fully understood when considered with respect to the following detailed description, appended claims and accompanying drawings, wherein:

DETAILED DESCRIPTION OF THE INVENTION

Figure 1:
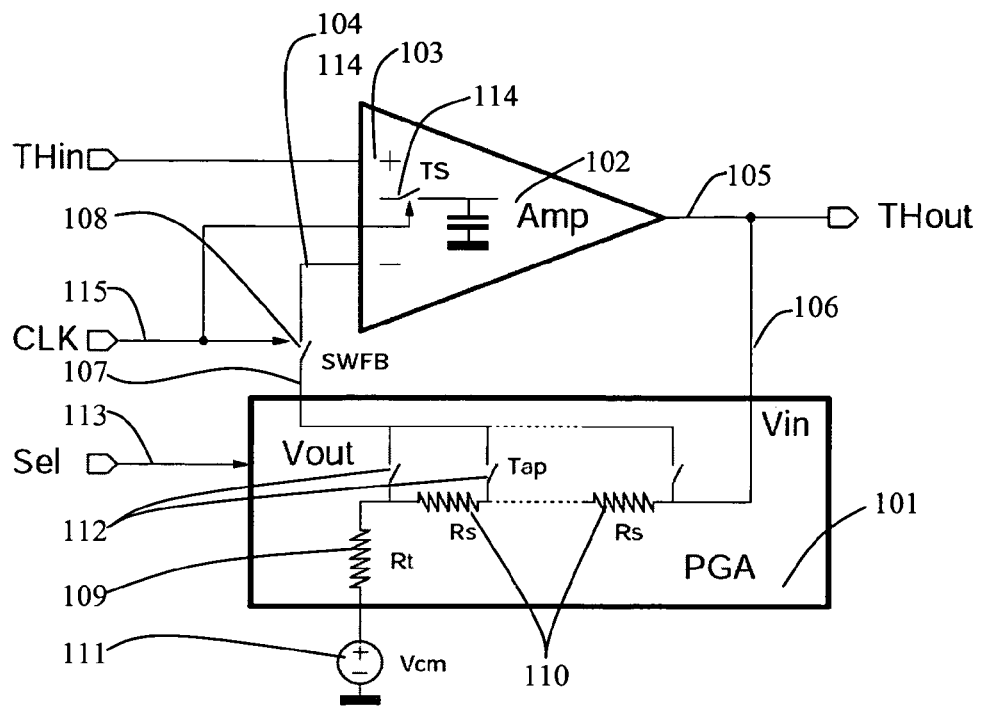
FIG. 1 shows a gain attenuator of conventional art.

FIG. 1 shows a programmable gain attenuator (PGA) 101, which is in the negative feedback path of an operational amplifier 102. This circuitry is a straightforward approach of a PGA, which is known from prior art.

The positive connector 103 of the amplifier 102 is connected to the analog signal, which is to be tracked.

The output connector 105 of the operational amplifier 102 provides the output signal of the circuitry, which is the modified input signal.

The input connector Vin 106 of the PGA 101 is connected to the output connector THout 105 of the operational amplifier 102, so that the output signal of the operational amplifier 102 is fed into the PGA 101.

The output connector Vout 107 of the PGA 101 is connected to the negative input connector 104 of the operational amplifier 102 by means of a switch 108. Thus, if the switch 108 is closed, the PGA 101 forms a negative feedback line to the operational amplifier 102.

The PGA comprises a voltage divider consisting of a first resistive device Rt 109 and further resistive devices Rs 110. The further resistive devices 110 are in series, the last of which is connected to the input connector Vin 106 of the PGA 101. The first resistive device 109 is at one end connected to a reference voltage Vcm 111 and to the next of the line of the further resistive devices Rs 110. Each of the taps between the resistive devices of the voltage divider can be connected to the output Vout 107 of the PGA via one of the tap switches 112. As the voltage supplied to the negative input connector 104 of the operational amplifier is defined by one of the tap switches 112 of the PGA, the gain of the operational amplifier 102 is defined by said setting of the tap switch 112, so that the amplitude of the output signal of the amplifier 102 stays within a (small) required range for different amplitude values of the input signal.

Tap switches 112 thus implement the feature of the PGA 101 of being programmable.

The PGA furthermore comprises a select input line 113 for receiving information for setting the tap switches 112.

The operational amplifier 102 has an internal switch 114 for switching between the two states of the track-and-hold amplifier, namely the track-state and the hold-state. Usually the internal switch 114 is set via a clock signal CLK 115, which also triggers the switch SWFB 108 connecting the PGA 101 to negative input connector 104 of the operational amplifier 102, so that each of the states lasts half the clock cycle.

If the internal switch 114 and the connecting switch 108 and at least one of the tap switches 112 are closed and thus in conducting state then the circuit is in track mode, so that the output signal THout follows the input signal Thin.

During the hold mode, the internal switch TS 114 separates the amplifier stages and the switch SWFB 108 separates the negative input connector 104 from the PGA 101. This supports the input stage of the operational amplifier 102 to slew faster to the actual amplitude value of the input signal THin at the beginning of the next track phase.

Figure 2:
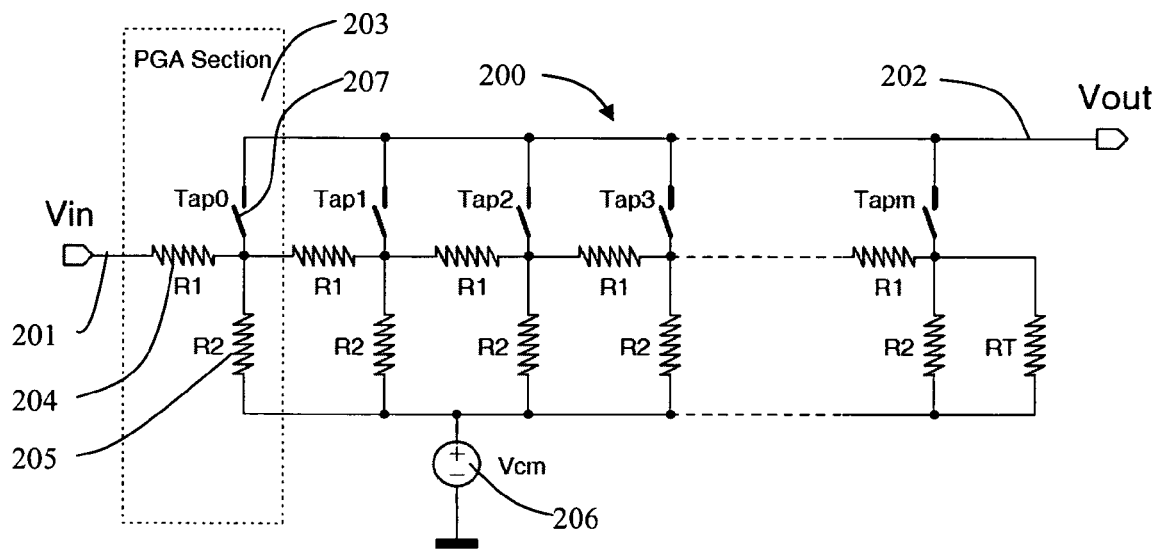
FIG. 2 shows another gain attenuator of conventional art.

FIG. 2 shows a different circuitry of a PGA 200, which is also known from prior art. This PGA 200 is also planned to be in the feedback around an operational amplifier similar to the PGA of FIG. 1. The operational amplifier is not shown in this figure.

The PGA 200 comprises multiple PGA sections 203. As shown in the dotted rectangle a PGA section comprises a voltage divider consisting of first resistive device R1 204 and a second R2 205. One end of the first resistive device R1 204 is connected to the input connector Vin 201. One end of second resistive device R2 205 is connected to a voltage supply Vcm 206. Similar to the PGA of FIG. 1 the tap between the two resistive devices R1 204 and R2 205 is connected to the output connector Vout 202 by means of a tap switch 207. A multiplicity of these PGA sections is cascaded, whereby one end of the first resistive devices R1 204 of each subsequent PGA section is connected to the tap between the resistive devices of the preceding PGA section.

The transfer function between the input Vin 201 and the output Vout 202 and thus the gain of the amplifier can be defined by the setting of tap switches 207.

Both the PGA circuits of FIG. 1 and FIG. 2 use one switch for one gain setting. These switches introduce two parasitic effects into the feedback path around the operational amplifier. As each of the switches is implemented by a transistor, usually a MOS transistor, each switch introduces a capacity and a resistance into the path containing the switch. This capacitance along with the resistance acts as an RC-filter and thus works towards lowering the frequency of the parasitic pole in the feedback path. If that frequency is lowered too much, the pole in the feedback path reduces the phase margin of the loop, hence affecting the stability of the feedback amplifier.

Besides the switches in the PGA the switch SWFB 108 used to couple the PGA to the negative input of the operational amplifier contributes its own share of parasitics, both capacitive and resistive.

Thus there is a need for reducing the parasitic effects in the feedback path.

To minimize the parasitic capacitance coupled to the negative input of the operational amplifier, the total size of the tap switches and of the switch used to connect the PGA to the negative input of the operational amplifier has to be reduced. This can be accomplished by reducing either the number or the width of the tap switches. Both these options are in contrast with the need for a lower resistance when the switches are in state ON, which calls for a larger size of the tap switches and also a larger size of the switch connecting the PGA to the negative input of the operational amplifier. Alternatively the functionality of the switch connecting the PGA to the operational amplifier can be implemented by the tap switches, so that the tap switches are clocked tap switches.

Furthermore topology changes of the circuitry should account for the requirement that any changes made to increase the bandwidth of the PGA should not affect the number of possible gain settings that can be implemented.

Figure 3:
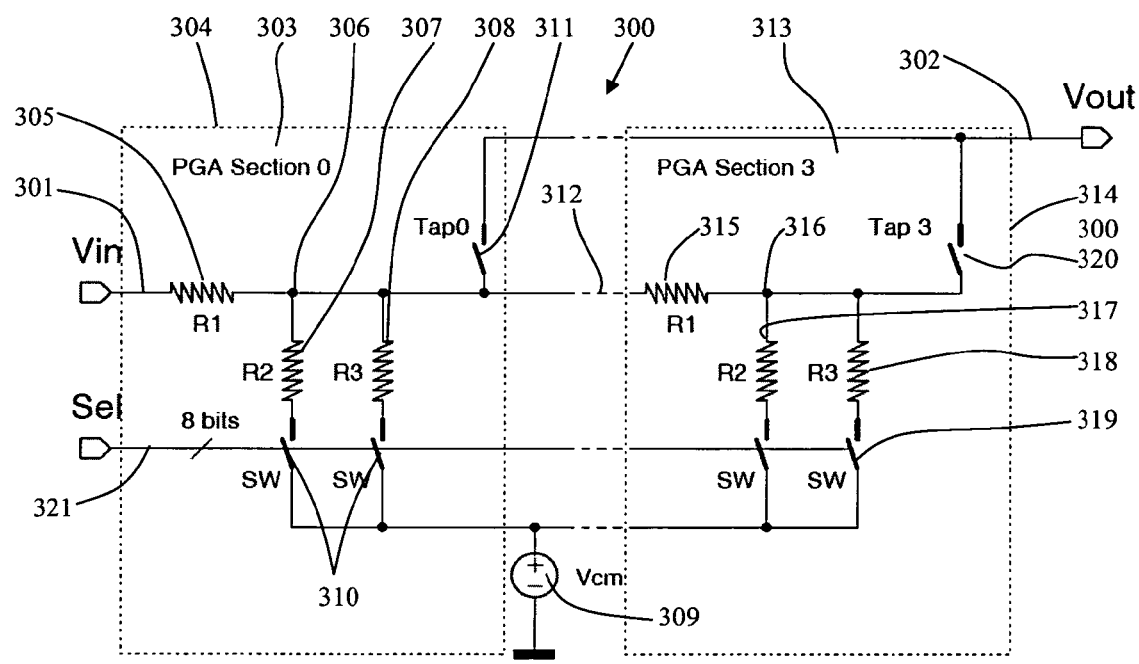
FIG. 3 shows a first embodiment of a programmable gain attenuator (PGA) according to the invention.

Turning now to FIG. 3, a programmable gain attenuator PGA 300 according to the invention is disclosed. The PGA 300 has an input connector Vin 301 and an output connector Vout 302. The PGA 300 is provided to be in the feedback path around an operational amplifier used as a track-and-hold amplifier—which is not shown here—namely by connecting the input connector Vin 301 to the output connector of an operational amplifier and the output connector Vout 302 to the negative input of the operational amplifier.

The PGA 300 has at least one PGA section 303 as defined by the dotted line 304. Each PGA section 303 comprises a voltage divider. The voltage divider comprises a single first resistive device R1 305, at least two resistive devices R2 307 and R3 308 serving as second resistive devices in the voltage divider and a tap 306 between the first and second resistive devices.

The input of the voltage divider of first PGA section 303, namely the first resistive device R1 305, is connected to the input connector Vin 301 of the PGA 300 with its one end. The other end of the voltage divider, namely the individual second resistive device R2 307 and R3 308 of the voltage divider, is connected to a reference voltage Vcm 309 by means of a switch SW 310. The switches SW 310 can be set individually with respect to the neighboring switches 310 of the same PGA section 303 or another adjacent, cascaded PGA section 313.

The tap 306 is connected via a tap switch 311 to the output connector Vout 302 of the PGA 300. If the tap switch 311 of at least one PGA section 303 is closed, then the feedback line around the operational amplifier—not shown here—is closed.

The voltage between input connector Vin 301 and the output connector Vout 302 of the PGA 300 can be changed by closing the tap switch 311 of a PGA section 303 and by closing at least one of the switches 310. For example, if the switch SW 310, which is connected to the resistive device R2 307 is closed and all other switches SW 310 are left open, then the voltage divider consisting of the resistive devices R1 305 and R2 307 defines the voltage of the tap 306, which is connected by means of a tap switch 311 to the output connector Vout 302.

The resistive value of the resistive device located between the tap and the reference voltage Vcm 309 is defined by setting the switches SW 310. Thus the voltage of the tap 306 can be altered by closing one or more of the switches SW 310.

Alternatively, the switch SW 310 being connected to the resistive device R2 307 is open and the switch SW 310 connected to the parallel resistive device R3 308 may be closed. In this case the voltage of the tap 306 is defined by the voltage divider consisting of the resistive devices R1 305 and R3 308, namely by the ratio of their resistive values.

In a preferred embodiment, the values of the second resistive devices are different from each other, so that a maximum of different settings is possible by closing one or more switches SW 310 at a time.

Hence another variation of setting the switches SW 310 and thus of defining the voltage at the tap 306 is to close both switches SW 310, so that the resistive devices R2 307 and R3 308 are parallel and thus the combination of these makes up the second resistive device in the voltage divider.

In this way the voltage of the tap 306, which is the voltage of the output connector Vout 302 of the PGA 300 and thus the gain of this gain attenuator can be defined by setting the tap switch 311 and the switches SW 310.

The disclosed gain attenuator as shown in this embodiment introduces one tap switch 311 into the feedback line and allows three different gain settings. The switches SW 310 do not contribute to the parasitic and thus undesirable capacitance and resistive value as they are not in the feedback path around the operational amplifier. Therefore this circuitry reduces the amount of parasitic effects, which stick to each switch/transistor introduced into the feedback line that is the line from the input connector Vin 301 to the output connector Vout 302 of the PGA 300.

The PGA 300 may also comprise further PGA sections, which is indicated by the dotted line 312 connecting the first PGA section 303 and another PGA section 313, which is surrounded by the dotted line 314.

Further PGA sections in this PGA 300 are designed similar to the first PGA section 303. For example PGA section 313 comprises a voltage divider having a first resistive device R1 315. The second resistive devices R2 317 and R3 318 are connected to a tap 316 with their one end and to the reference voltage 309 by means of switches 319. Also the tap 316 is connected to the output connector Vout 302 via a tap switch 320.

The first resistive device R1 315 is connected to the tap 316 of this PGA section 313 and to the tap 306 of the preceding PGA section. The PGA sections are thus cascaded.

The setting of the gain of the PGA 300 with more than one PGA section is similar to setting the gain of a PGA 300 with only one PGA section, except that an additional PGA section increases the count of possible gain settings. Different gain values can be set by any combination of the switches SW 310, 319 and the tap switches 311, 320. In the example shown, there are four switches SW 310, 319 and two tap switches 311, 320, that is six switches in total. So there are $2^{6-1}=2^5=32$ possible gain values, if the values of the resistive devices are not identical.

The gain attenuator further has at least one select input line Sel 321 for receiving information for setting the switches. The information received via this line may be analog or digital or there may be one select input line 321 for each switch. The switches SW 310, 319 as well as the tap switches 311, 320 may be set by information received via the select input line Sel 321.

Figure 4:
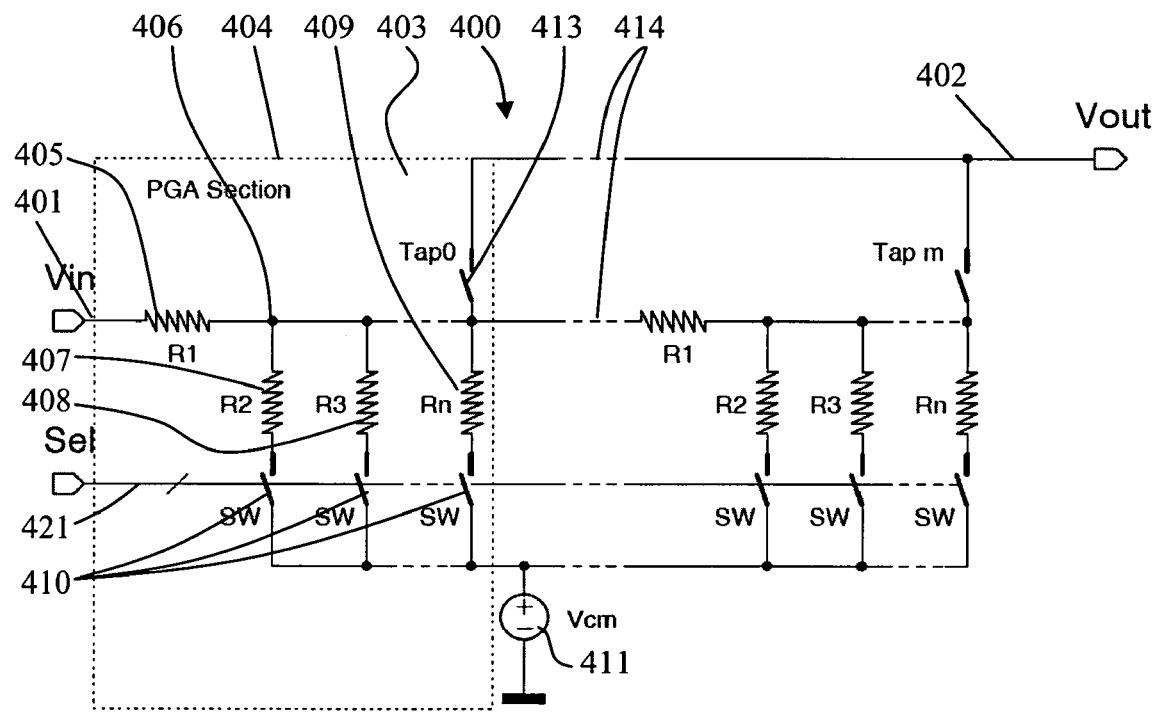
FIG. 4 shows a second embodiment of a PGA according to the invention.

FIG. 4 shows a second embodiment of a PGA 400 according to the invention. Similar to the PGA of FIG. 3 this embodiment has an input connector Vin 401, an output connector 402 and at least one PGA section 403, as indicated by the dotted line 404.

The PGA section 403 is similar in design to the PGA sections in FIG. 3, except there are several, at least more than two, resistive devices serving as second resistive devices in the voltage divider of that PGA section. The voltage divider has a first resistive device R1 405. The second resistive devices R2 407, R3 408 and Rn 409 are connected to the first resistive device R1 405, the other end of each second resistive device is connected via a switch SW 410 to a reference voltage Vcm 411. The dotted line 412 indicates that there can be even more resistive devices serving as second resistive devices in the voltage divider than the three examples shown in the figure, each of these creates—in combination with the first resistive device R1 405—another rate of the voltage divider, provided that the values of the second resistive devices of that PGA section are different.

The tap 406 is connected to the output connector Vout 402 via a tap switch 413.

Furthermore there may be several cascaded PGA sections in the PGA as is indicated by the dotted line 414. Thus there may be a multiplicity of cascaded PGA sections wherein each PGA section has a voltage divider with a multiplicity of adjustments.

For a PGA with a given number of n PGA sections, wherein each PGA section comprises a given number of m switches SW and thus voltage divider adjustments, the total number of switches in the PGA can be determined by n·m+n. Thus the possible number of gain settings in such a generalized PGA is $2^{n\cdot m+n}-1$, if the values of the resistive devices within one PGA section are different.

Similar to the embodiment of FIG. 3 the gain attenuator 400 comprises at least one input line 421 for receiving information for setting the switches SW 410 as indicated by the line touching the switches SW 410. Although not indicated by a crossing line, in a preferred embodiment the information for setting the tap switches 413 can also be received via this input line 421.

Figure 5:
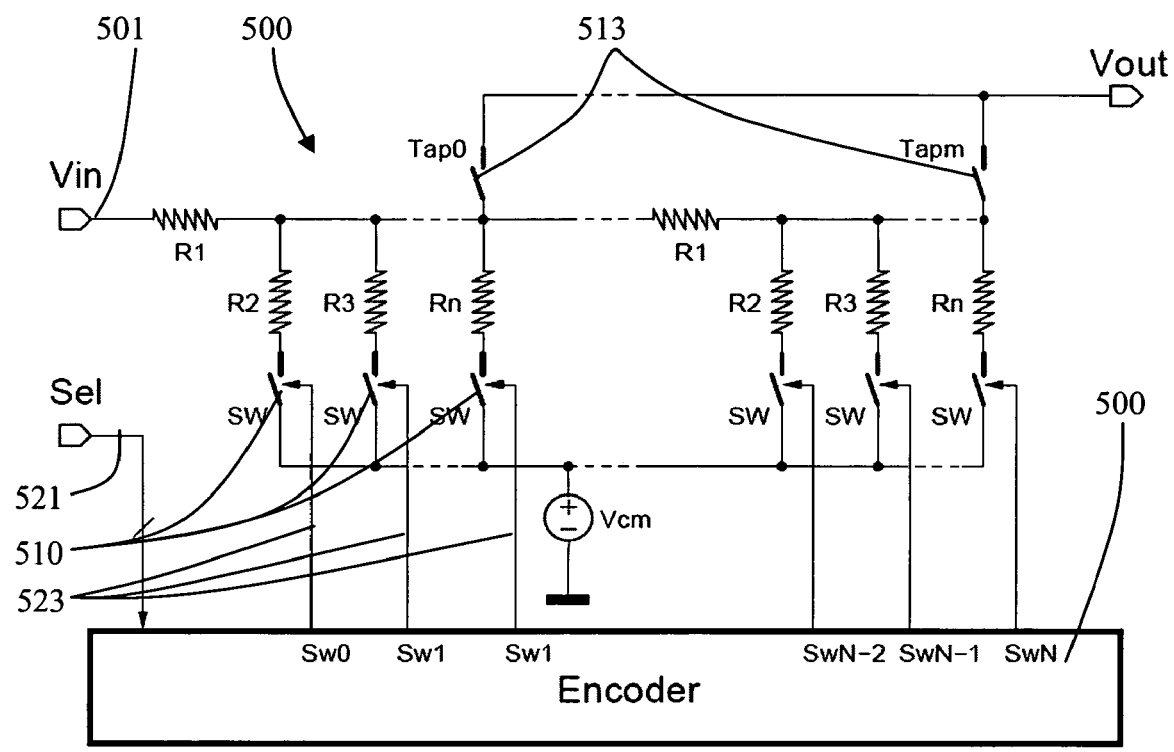
FIG. 5 shows another embodiment of a PGA according to the invention.

FIG. 5 shows a further improved embodiment of a programmable gain attenuator 500, having an input connector Vin 501, an output connector 502 and at least one PGA section, wherein the PGA section is designed as described in the previous FIGS. 3 and 4.

The PGA 500 furthermore has an input line 521 for receiving information for setting the switches SW 510. Although not indicated in the drawing the information for setting the tap switches 513 may also be delivered to the PGA via this input line 521, so that the information received via input line 521 comprises the information on how to set all switches in the PGA.

The information received via input line 521 is fed into the encoder 522, which is connected to each of the switches SW 510 via lines 523. The encoder 522 interprets the received information and sets the switches SW 510 accordingly by signaling a corresponding signal via the lines 523, wherein one or more than one switch SW 510 can be set to the conducting state at the same time.

Preferably the encoder receives the information for setting the switches SW 510 as digital information, for instance as a binary word consisting of eight bits. The encoder reads and interprets the information and translates the information into control bits for the switches SW 510 and the tap switches 513, wherein the eight bits of the information word are not necessarily assigned each to a particular switch. Instead the information can be rearranged so that more than eight switches can be controlled. For example the information can be a decimal value of a requested gain value. The encoder knows the settings for the requested gain and thus sets the switches SW 510 and the tap switches 513 accordingly.

Figure 6:
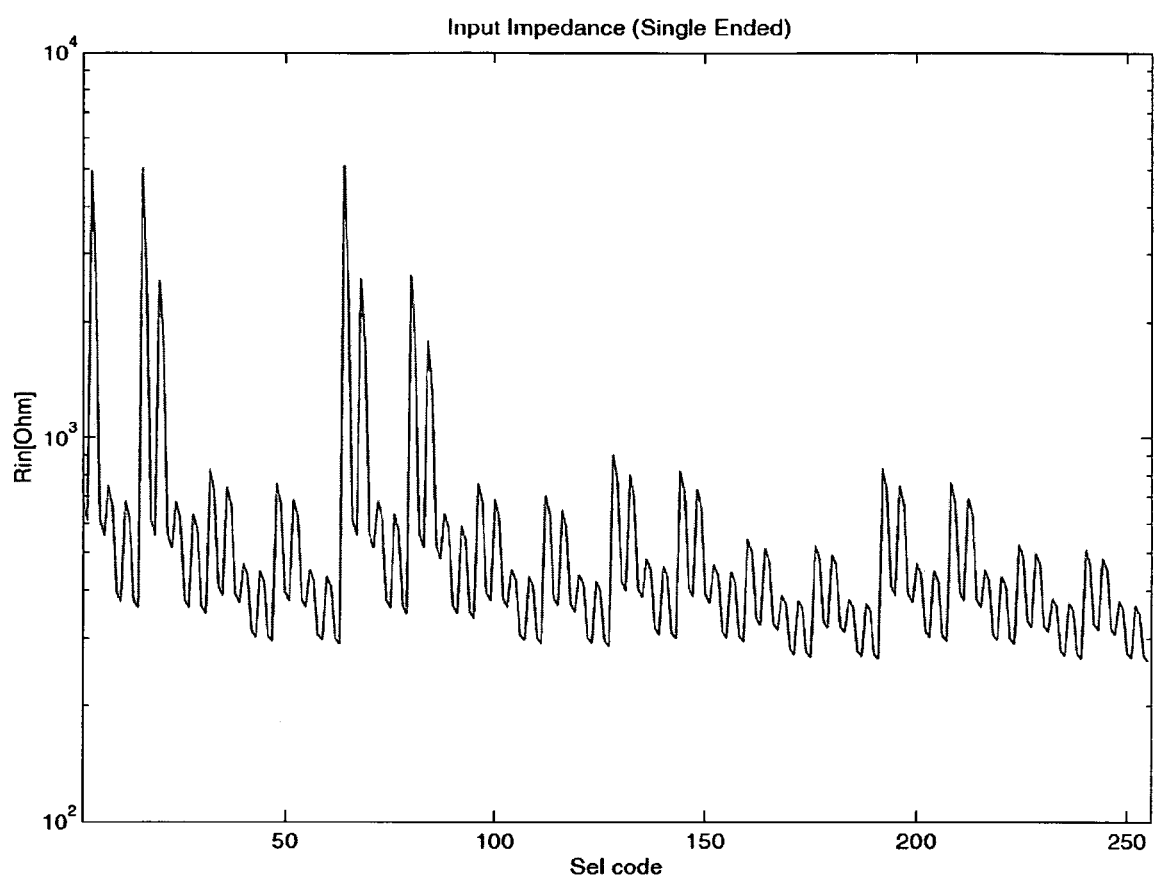
FIG. 6 shows a graph of the input impedance of a PGA according to the invention.

FIG. 6 shows a graph of the input impedance of a PGA according to FIG. 4, wherein the PGA consists of 4 PGA sections each with two voltage dividers and thus two switches SW, so that there is a total of 8 switches SW in the PGA. The resistive devices are ohmic resistors having values of R1=2.4 kΩ/64 for the first resistor, R2=2.4 kΩ for one and R3=2.4 kΩ/8 for the other second resistor.

The reference voltage Vcm in the PGA may be a common-mode voltage source for a depicted differential application or simply a ground for a single-ended application. In this example of a PGA, the reference voltage Vcm is a ground.

The eight switches SW can map 256 different states, so that the PGA can be set to 256 different attenuation values.

The vertical y-axis of the graph shows the input impedance of the PGA in a range between 100Ω and 10,000Ω in an exponential presentation. On the horizontal x-axis the settings of the switches are plotted, whereby the states of the eight switches are assigned numerical values.

The input impedance for the status where all switches are open, which corresponds to the numerical value of 0, is not shown. In this case the input impedance of the PGA is infinite.

As can be seen from the graph of FIG. 6 the input impedance of the PGA ranges from 250Ω to 5 kΩ depending on the settings of the switches. Although the range between the maximum and the minimum value of the input impedance is big, most of the impedance values are close to the minimum value. This property of the PGA can be used in the system design to draw the performance specifications for the circuit driving the PGA or to choose the values of the resistors, so that for example a minimum impedance may be guaranteed.

The new PGA does not show a monotonic behavior of the input impedance with increasing values of the selection word neither as a function of the selected tap switch.

Figure 7:
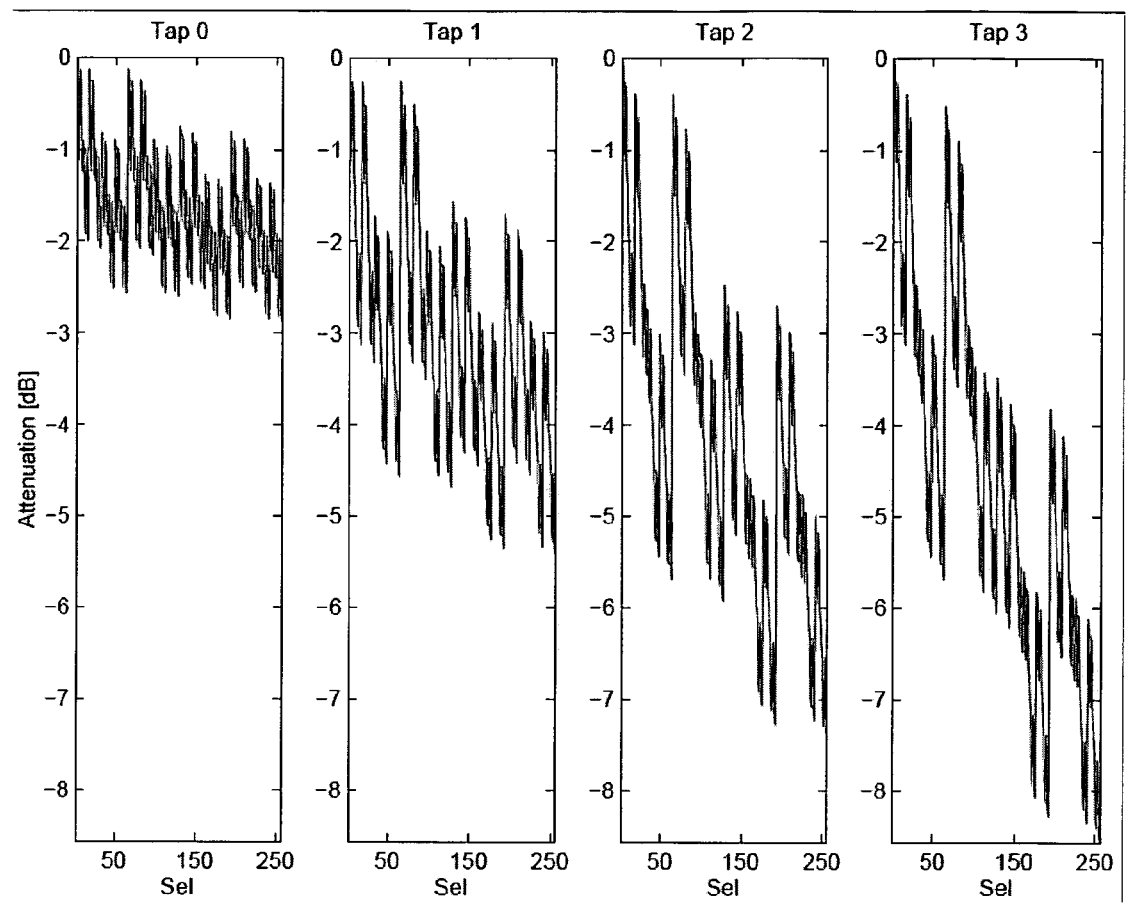
FIG. 7 shows the attenuation of the PGA according to the invention.

FIG. 7 shows four graphs displaying the attenuation of the PGA depending from the setting of the switches SW. The PGA is the one as in FIG. 6, thus the PGA comprises four PGA sections each having two secondary resistive devices.

Each x-axis shows the numerical value of the select word, which controls the setting of the switches SW. The y-axis shows the corresponding attenuation of the PGA in dB.

The graphs each show the attenuation for all 255 different settings, wherein in each graph only one of the four tap switches is closed. In the left graph only the tap switch of the first PGA section, that is the one being closest to the input connector, is closed. The adjacent graph shows the curve of the attenuation if only the tap switch of the PGA section being adjacent to the first PGA section is closed. Similarly the next graph shows the attenuation of the PGA with the tap switch of the next cascaded PGA section being closed. Lastly the right graph in FIG. 7 shows the attenuation of the PGA with the tap switch of the last cascaded PGA section being closed, which is closest to the output connector Vout of the PGA.

As is obvious from the graphs the attenuation is not a monotonous falling curve with increasing numerical values of the selection word. However they cover a big range of attenuation values.

As there are four tap switches and eight switches SW in the described PGA as described above the number of available attenuation settings is 1024. Although most of the attenuation values are fairly spaced apart a big range of attenuation values is covered.

Figure 8:
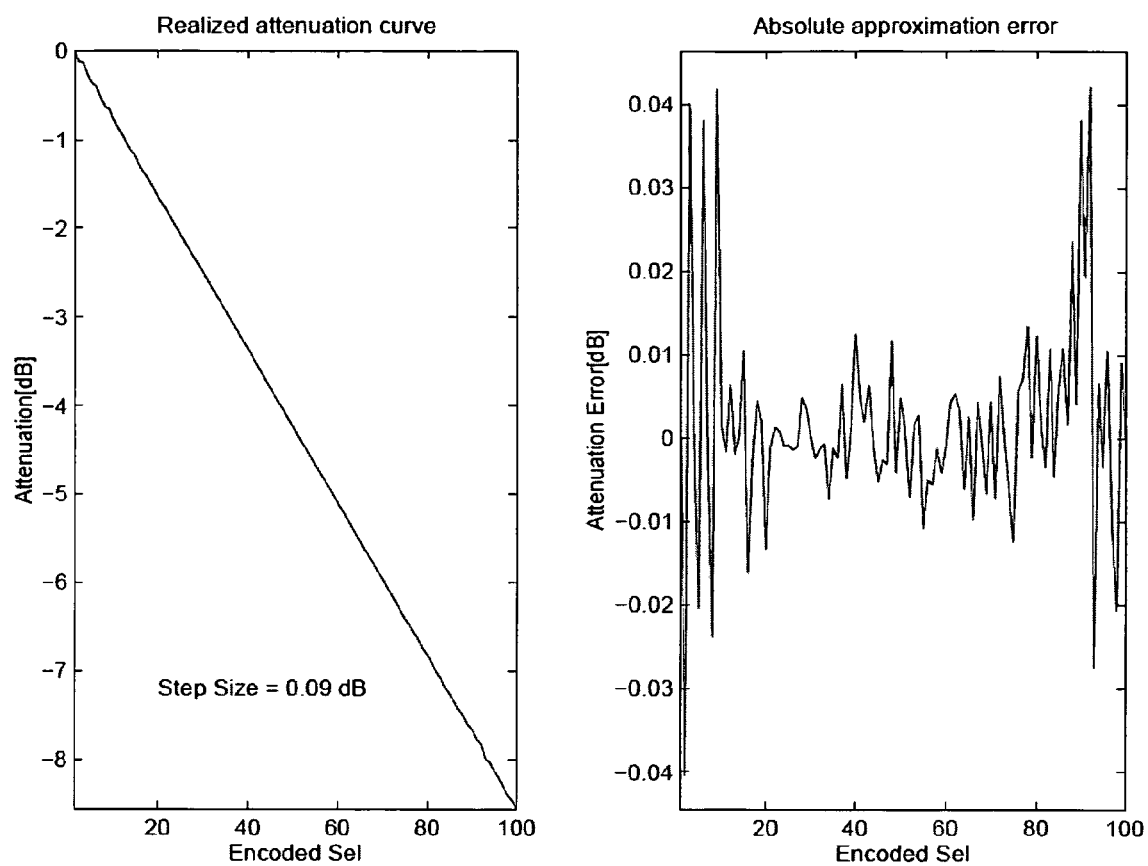
FIG. 8 shows a graph of possible attenuation values of the PGA.

FIG. 8 shows all possible 1024 attenuation of the PGA as a function of the select word. The graph on the left side shows the attenuation values as a function of the numerical value of the select word. It is obvious that a given attenuation value can be selected by different values of the select word.

The graph on the right hand side of FIG. 8 shows a pseudo-monotonous curve, wherein the attenuation value of the PGA increases with increasing values of the select word. However the gradient of the curve is fairly constant.

This behavior of the PGA can be achieved by using a PGA according to FIG. 5. The information on how to set the switches SW 510 is received for example as a digital value, the select word, by the encoder 522. The encoder encodes the numerical value of the select word into corresponding settings of the switches SW 510, so that for a small numerical value of the select word the attenuation of the PGA is small and increases with increasing values of the select word. In this way the information received via the input Sel 521 does not control the switches SW 510 directly but is interpreted by the encoder, which generates the control signals—bits—for the switches corresponding to the value of the received information.

The tap switches 513 can be controlled by also using the input line Sel 521, whereby the encoder determines which of the tap switches 513 is to be closed for the desired attenuation value. Alternatively a second input line can be used for controlling the tap switches 513.

FIG. 8 shows on the left side an attenuation curve of a PGA, wherein the PGA has been designed to implement a desired attenuation curve. The information determining the desired attenuation is encoded in order to produce switch settings according to an attenuation curve being linear-in-dB, wherein the information about the desired attenuation uses 100 steps for attenuation between 0 and −8.5 dB. In this example the encoder drives both the tap switches and the switches SW. The resulting attenuation curve has an attenuation step size of 0.09 dB.

The graph on the right hand side of FIG. 8 shows the error of the desired linear-in-dB attenuation curve in dependency from the encoded Sel value.

As can be seen from this graph, the biggest error values occur at the beginning and at the end of the attenuation values. However the maximum error value is around 0.04 dB for any selected step, whereas the average error is much smaller.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A programmable gain attenuator having an input (Vin) and an output (Vout), comprising:
    at least two voltage divider sections, each having a first resistive device, a second resistive device, and a tap between them, the second resistive device comprising two or more parallel resistive devices, and wherein a subsequent voltage divider section is connected to the tap of a preceding voltage divider section,
    wherein the at least two voltage divider sections are collectively connected at a first end thereof to the input and at a second end thereof to a reference voltage,
    wherein the output is connected to the tap of each voltage divider section,
    wherein a gain of the programmable gain attenuator is alterable by altering the value of at least one of the second resistive devices of a voltage divider section, the second resistive devices being in circuit between their respective taps and the reference voltage with the two or more parallel resistive devices within their corresponding voltage divider section having different resistive values and connected to the reference voltage by means of corresponding reference voltage switches,
    wherein each component included in the two or more parallel resistive devices influences the gain only when the corresponding reference voltage switch of the component is closed, and
    wherein the at least two voltage divider sections comprise a first voltage divider section and one or more further voltage divider sections, the one or more further voltage divider sections being cascaded such that the first resistive device of each further voltage divider section is directly connected to the tap of a preceding voltage divider section, and
    wherein the tap of each of the first voltage divider section and the one or more further voltage divider sections is connected by corresponding tap switches to the output.

2. The programmable gain attenuator of claim 1, wherein the tap switches and reference voltage switches are MOS transistors.

3. The programmable gain attenuator of claim 1, further comprising an input line for receiving information to set the tap switches.

4. The programmable gain attenuator of claim 3, further comprising an encoder for setting the tap switches according to the received information.

5. A track-and-hold circuit comprising:
    an operational amplifier having a non-inverting input, an inverting input and an output, and
    a programmable gain attenuator (PGA) having an input connected to the output of the operational amplifier and an output connected to the inverting input of the operational amplifier by means of a feedback switch, the PGA comprising:
    at least two voltage divider sections, each having a first resistive device, a second resistive device, and a tap between them, the second resistive device comprising two or more parallel resistive devices, wherein a subsequent voltage divider section is connected to the tap of a preceding voltage divider section,
    wherein the at least two voltage divider sections are collectively connected at a first end thereof to the PGA input and at a second end thereof to a reference voltage,
    wherein the output of the PGA is connected to the tap of each voltage divider section,
    wherein a gain of the programmable gain attenuator is alterable by altering the value of at least one of the second resistive devices of a voltage divider section, the second resistive devices being located in circuit between their respective taps and the reference voltage with each of the two or more parallel resistive devices within their corresponding voltage divider section having different resistive values and connected to the reference voltage by means of corresponding reference voltage switches, wherein each component included in the two or more parallel resistive devices influences the gain only when the corresponding reference voltage switch of the component is closed, and wherein the at least two voltage divider sections comprise a first voltage divider section and one or more further voltage divider sections, whereby the one or more further voltage divider sections are cascaded such that the first resistive device of each further voltage divider section is directly connected to the tap of a preceding voltage divider section, and wherein the tap of each of the first voltage divider section and the one or more further voltage divider sections is connected by means of corresponding tap switches to the output.

6. The track-and-hold circuit of claim 5, wherein the tap switches and reference voltage switches of the PGA are MOS transistors.

7. The track-and-hold circuit of claim 5, wherein the PGA further comprises an input line for receiving information to set the tap switches.

8. The track-and-hold circuit of claim 7, wherein the PGA further comprises an encoder for setting the tap switches according to the received information.

9. A programmable gain attenuator with an input (Vin) and an output (Vout), having a gain defined as the electric potential between the output and the input, comprising:

at least two voltage divider sections, each having a first resistive device, a second resistive device having two or more parallel resistors, and a tap between the first resistive device and the second resistive device, wherein a subsequent voltage divider section is connected to the tap of a preceding voltage divider section, wherein the at least two voltage divider sections are collectively connected at a first end thereof to the input with one end and at a second end thereof to a reference voltage, wherein the output is connected to the tap of each voltage divider section by means of a corresponding tap switch, wherein the gain of the programmable gain attenuator is alterable by altering the value of at least one of the second resistive devices, and wherein each resistor of the two or more parallel resistors influences the gain only when a reference voltage switch connecting the resistor to the reference voltage is closed;

an input line for receiving information to set the tap switches; and an encoder for setting the tap switches according to the received information.

* * * * *